United States Patent
Davis

(10) Patent No.: US 7,580,233 B2
(45) Date of Patent: Aug. 25, 2009

(54) PROTECTING CIRCUITS FROM ELECTROSTATIC DISCHARGE

(75) Inventor: Timothy Davis, Arlington, TX (US)

(73) Assignee: Via Technologies, Inc., Hsin-Tien, Taipei (TW)

( * ) Notice: Subject to any disclaimer, the term of this patent is extended or adjusted under 35 U.S.C. 154(b) by 831 days.

(21) Appl. No.: 11/256,433

(22) Filed: Oct. 21, 2005

(65) Prior Publication Data

US 2007/0091524 A1    Apr. 26, 2007

(51) Int. Cl.
    *H02H 9/00*    (2006.01)
(52) U.S. Cl. ........................................ 361/56
(58) Field of Classification Search .................... 361/56
    See application file for complete search history.

(56) References Cited

U.S. PATENT DOCUMENTS

| | | | |
|---|---|---|---|
| 5,239,440 | A | 8/1993 | Merrill |
| 5,319,259 | A | 6/1994 | Merrill |
| 5,754,380 | A | 5/1998 | Ker et al. |
| 6,369,613 | B1 * | 4/2002 | Costello et al. ............. 326/83 |
| 6,529,035 | B2 | 3/2003 | Schroeder et al. |
| 6,529,359 | B1 * | 3/2003 | Verhaege et al. ........... 361/100 |
| 6,545,520 | B2 * | 4/2003 | Maloney et al. ............ 327/313 |
| 6,576,958 | B2 | 6/2003 | Ker et al. |
| 6,653,709 | B2 | 11/2003 | Wu et al. |
| 6,744,107 | B1 | 6/2004 | Ker et al. |
| 6,788,507 | B2 | 9/2004 | Chen et al. |
| 6,826,026 | B2 | 11/2004 | Duvvury et al. |
| 2004/0188776 | A1 | 9/2004 | Russ et al. |
| 2004/0251502 | A1 | 12/2004 | Reddy et al. |

* cited by examiner

*Primary Examiner*—Stephen W Jackson
*Assistant Examiner*—Ann T Hoang
(74) *Attorney, Agent, or Firm*—Thomas, Kayden, Horstemeyer & Risley

(57) ABSTRACT

Circuits and methods for protecting a circuit from an electrostatic discharge (ESD) event are disclosed herein. One such method includes detecting when a circuit to be protected is powering up and disabling an output driver of the circuit to be protected when the circuit is powering up. The power up sequence, for example, may be the result of a sensed ESD event. In addition, the present disclosure includes a circuit that comprises an ESD sensing circuit and a disable circuit. The ESD sensing circuit includes an RC circuit connected between VDD and VSS and a first inverter connected between a second inverter and a node that connects a resistor with a capacitor of the RC circuit. The disable circuit includes a first PMOS transistor and a first NMOS transistor, the first PMOS transistor configured to receive an EN signal from the second inverter, and the first NMOS transistor configured to receive an $\overline{EN}$ signal from the first inverter. The first PMOS transistor is further configured to connect a second PMOS transistor to VDD when EN is low, and the first NMOS transistor is further configured to connect a second NMOS transistor to VSS when $\overline{EN}$ is high.

19 Claims, 2 Drawing Sheets

PROTECTING CIRCUITS FROM ELECTROSTATIC DISCHARGE

TECHNICAL FIELD

The present application relates to semiconductor chips and protection circuitry built into the chips. More particularly, the present application relates to circuits and methods for protecting semiconductor chips from electrostatic discharge (ESD).

BACKGROUND

It is well known that static electricity can be produced in every day situations. Static electricity is created when electrons are transferred from one object to another, thereby negatively charging one object while positively charging the other. An electrostatic potential, either positive or negative, can be carried on the skin of a person, for example, and discharged to an object having a different electrostatic potential. When an electric field between oppositely charged objects breaks down, an electrostatic discharge (ESD), or "shock", can occur. An ESD event is characterized by a high voltage, but the current and charge are relatively low.

As an example, when a person walks across a carpet, a voltage on the order of about 10 kilovolts (kV) can be produced. Although a discharge of such a voltage may cause only mild discomfort for the person, such a discharge can destroy semiconductor chips and other computer components, which are extremely sensitive to ESD. In fact, a discharge of a voltage as low as 10 volts, far too small to even be felt by a person, can damage semiconductor chips. For this reason, circuitry for protecting chips from destructive ESD pulses is typically designed into chips. This built-in ESD protection circuitry is intended to provide protection during the physical handling of the chip before it is actually installed on a circuit board or integrated into a larger electronic system.

FIG. 1 illustrates a portion of a conventional semiconductor chip 10. The chip 10 shown in FIG. 1 includes functional circuitry 12 for performing logic operations and a plurality of pads 14 for connection to external circuitry (not shown). Some pads 14, for example, may be reserved for connection to power or ground. Positioned between the functional circuitry 12 and the pads 14 are input/output (I/O) circuits 16. The I/O circuits 16 may include, for example, output drivers for driving the pads 14 to either a logic high value or a logic low value.

If the chip 10 were to experience an ESD pulse, the voltage discharge will usually occur at the pads 14, including the power terminal pad(s) and ground terminal pad(s) of the chip 10. For this reason, the I/O circuits 16 will experience the ESD pulse first and will typically be the weakest link in the ESD equation.

Therefore, the I/O circuits 16 may also be designed with ESD protection circuitry, in addition to the output drivers, for protecting the chip 10 and especially the output drivers. Furthermore, an output driver and ESD protection circuit can be combined in the I/O circuit 16 in such a way as to save area on the chip, which can be beneficial for reducing the chip size.

FIG. 2 illustrates a conventional I/O circuit 16 which, as mentioned with respect to FIG. 1, can be positioned between the functional circuitry 12 and the pads 14 of the chip 10. The I/O circuit 16 of FIG. 2 includes an output driver 18 and an ESD protection circuit 20. The output driver 18 and the ESD protection circuit 20 may be part of the same circuit layout structure, if desired, using an interleaved configuration to reduce the overall area.

The output driver 18 includes a PMOS transistor 22 and an NMOS transistor 24. The PMOS transistor 22 receives at its gate a gate control signal PG from the functional circuitry 12, and the NMOS transistor 24 receives a gate control signal NG at its gate. Typically, the PG and NG signals are the same. During normal operation of the output driver 18, a low input at PG and NG turns on the PMOS transistor 22 to connect the respective pad 14 to VDD and turns off the NMOS transistor 24. A high input at PG and NG turns off the PMOS transistor 22 and turns on the NMOS transistor 24 to connect the pad 14 to VSS, or ground. Therefore, this output driver 18 acts as a CMOS inverter in that a high input to PG and NG produces a low output at the pad 14 and a low input to PG and NG produces a high output at the pad 14.

ESD protection circuits may be configured using any number of conventional ESD protection schemes. The ESD protection circuit 20 shown in FIG. 2, however, includes a plurality of fingers, each finger comprising one PMOS transistor 26 and one NMOS transistor 28. The ESD protection circuit 20 may include any number of fingers, depending on the desired capacity of ESD protection. For example, the I/O circuit 16 may have twelve fingers, where one finger is used as the output driver 18 and the remaining eleven fingers are used for the ESD protection circuit 20. The amount of energy that the ESD protection circuit 20 can dissipate is proportional to the total area of its fingers. Each of the two transistors of a finger is connected at a common node, which is connected to the respective pad 14 of the chip. Each PMOS transistor 26 of the ESD protection circuit 20 is connected in parallel with the PMOS transistor 22 of the output driver 18, and each NMOS transistor 28 of the ESD protection circuit 20 is connected in parallel with the NMOS transistor 24 of the output driver 18. The gates of the PMOS transistors 26 are tied to VDD and the gates of the NMOS transistors 28 are tied to VSS, thereby making the transistors 26 and 28 of the ESD protection circuit 20 essentially invisible during normal operation of the chip. These transistors 26 and 28, however, are used to protect the chip from ESD events, especially during the handling of the chip.

As is known in the art, each CMOS transistor inherently contains a small parasitic diode. The combination of the plurality of PMOS transistors 26 of the ESD protection circuit 20 possesses a large PMOS parasitic diode 30 that shunts current in a forward-bias direction from the pad 14 to VDD. Also, the combination of the plurality of NMOS transistors 28 possesses a large NMOS parasitic diode 32 that shunts current in a forward-bias direction from VSS to the pad 14. The parasitic diodes 30 and 32 can also shunt the current in a reverse-bias direction when a breakdown voltage is reached. The PMOS parasitic diode 30 and the NMOS parasitic diode 32 are capable of dissipating the charge to protect the chip from damage caused by the ESD event. The ESD protection circuit 20 and output driver 18 may include PMOS and NMOS transistors and drain diodes that are doped such that the effective breakdown voltage is adjusted to be lower than that of the transistors and diodes residing in functional circuitry 12. When a chip is manufactured with ESD protection circuitry, the chip can be tested using methods that attempt to model real-world ESD events. For example, one test includes applying a 2 kV pulse to different terminals of the chip to check whether or not the ESD protection circuit is able to dissipate the charge. The 2 kV pulse may be applied in at least four ways: from a pad to VDD, from VDD to a pad, from a pad to VSS, and from VSS to a pad. If the chip is able to manage these four pulses, then it is considered to have acceptable ESD protection.

However, even though prior art ESD protection circuits may pass these tests and operate well in most situations, it is possible that such ESD protection circuits may still fail under certain conditions that cannot be easily repeatable. It has been proposed that one possible reason for failure may be that an ESD event may actually cause a chip to be "powered up" by the discharge. This can be caused, for example, when an ESD pulse from the pad 14 to VSS is applied causing a current to be supplied through the PMOS parasitic diode 30 to VDD, powering up the chip. If by happenstance the NG signal at the gate of the NMOS transistor 24 of the output driver 18 is high and drives transistor 24 to a conductive state when the chip is powered up, a large current may be delivered to the relatively small area of the transistor 24, causing the output driver 18 to be destroyed. This occurs because the conducting transistor 24 has a lower impedance than the other parallel devices residing in the ESD protection circuit 20. There is therefore a need in the art to provide a circuit that can provide improved ESD protection, even when an ESD event powers up the chip.

SUMMARY

The present application describes circuits and methods for protecting semiconductor chips from damage caused by electrostatic discharge. In general, one method for protecting a circuit from an ESD event comprises sensing when a chip is powering up, such as by the presence of an ESD event, and disabling an output driver of a circuit to be protected in response to the chip powering up.

One embodiment, for example, of a circuit for protecting a semiconductor chip from an electrostatic discharge (ESD) event comprises an ESD sensing circuit and a disabling circuit. The sensing circuit, for instance, includes an RC circuit, a first inverter and a second inverter. The RC circuit includes a resistor and a capacitor connected in series between VDD and VSS. The first inverter is connected between the second inverter and a node that connects the resistor with the capacitor. The output of the second inverter provides an enable signal EN and the output of the first inverter provides a signal $\overline{EN}$ that is the inverse of EN.

The disable circuit, for instance, is configured to receive the EN and $\overline{EN}$ signals. The disable circuit includes a first PMOS transistor and a first NMOS transistor. The first PMOS transistor is configured to receive the EN signal at its gate. The first NMOS transistor is configured to receive the $\overline{EN}$ signal at its gate.

The first PMOS transistor is further configured to connect a second PMOS transistor to VDD when EN is low, and the first NMOS transistor is further configured to connect a second NMOS transistor to VSS when $\overline{EN}$ is high.

BRIEF DESCRIPTION OF THE DRAWINGS

Many aspects of the embodiments of the present disclosure can be better understood with reference to the following drawings. Like reference numerals designate corresponding parts throughout the several views.

DETAILED DESCRIPTION

The present application describes circuits and methods for protecting a semiconductor chip, or other computer components, from the damage caused by transients and electrostatic discharge (ESD) events. Since the prior art ESD protection circuits are able to function properly in most cases, the conventional circuitry of the prior art can be used without requiring a complete redesign.

However, since the prior art does not protect a chip in all possible situations, an additional protection circuit is added to overcome the deficiencies of the conventional circuits. The present application describes an ESD protection circuit that senses an ESD event and disables the transistors of an output driver when the ESD event is sensed. With the transistors of the output driver turned off, destructive currents will be blocked from flowing through them. The ESD currents can safely be channeled through the diodes 30 and 32 operating in either a forward-biased or reverse-breakdown mode. Therefore, even if an ESD event powers up the semiconductor chip and a random signal state attempts to turn on the transistors of the output driver, the embodiments described in the present application are capable of protecting the chip from the ESD event.

Figure 3A:
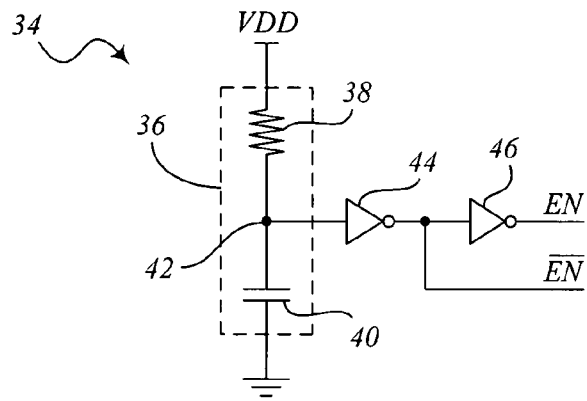
FIG. 3A is a schematic diagram illustrating an embodiment of an ESD sensing circuit.

FIG. 3A is a schematic diagram of an embodiment of an ESD sensing circuit 34. The ESD sensing circuit 34 includes an RC circuit 36 having at least one resistor component 38 and at least one capacitor component 40 preferably connected in series from VDD to VSS (ground). The output of the RC circuit 36 is located at a node 42 between the resistor 38 and capacitor 40. This node 42 is connected to series-connected inverters, including a first inverter 44 and a second inverter 46. The output of the second inverter 46 provides an enable signal EN. The output of the first inverter 44 provides a signal $\overline{EN}$, which is the inverse of signal EN. Although the RC circuit 34 is preferably positioned relatively near to the respective pad of the chip, the RC circuit 34 may be positioned at any desirable location on the chip. Basically, the ESD sensing circuit 34 senses when the chip is being powered up by a regular voltage source or by an ESD pulse. When VDD rises, because of an ESD pulse or when VDD is connected to a regular voltage source, the ESD sensing circuit 34 supplies enable or disable signals configured to turn off the output driver at least for the time it takes for an ESD pulse to be dissipated.

The values of the resistor 38 and capacitor 40 of the RC circuit 36 are selected to provide a timing characteristic such that, during the duration of the ESD pulse, the output of the RC circuit 36 at node 42 will not be able to rise to a destructive voltage and also does not rise high enough to switch the inverter 44. For example, the resistor 38 and capacitor 40 may be selected to provide a time constant of about 1 μsec or more, which can sufficiently accommodate an ESD pulse, which typically has a duration on the order of about ten nanoseconds. In this regard, the resistor 38 may have a value of 1 Mohm and the capacitor 40 may have a value of 1 pF.

The operation of the RC circuit 34 will now be described, given the initial condition, for instance, that the chip is not installed and all nodes and terminals are substantially neutral. Immediately before the chip experiences an ESD event, the terminals of the chip will be floating at substantially a ground potential. If an ESD pulse or other transient powers up the VDD terminal, the RC circuit 36 provides a voltage at the output node 42 that builds up gradually based on the time constant of the RC circuit 36. Since the voltage across the capacitor 40 can not be changed instantaneously, the initial voltage across the capacitor 40 will remain at about zero volts, or VSS. The large voltage difference across the resistor 38 causes a current to flow from VDD to the node 42. This gradually charges up one of the plates of the capacitor 40 to create an increasing voltage at node 42 until it eventually approaches VDD and the voltage across the resistor 38 becomes zero. The duration of a typical ESD pulse is typically much smaller, e.g. about ten nanoseconds, than the charging time of the capacitor 40. When the device is powering up, the RC circuit 36 has a time constant that sets the time it takes the chip to power up. For 1 μsec, for example, the output will be turned off. Since an ESD event has a much shorter duration than that, the outputs will be off during an ESD pulse and the current will flow through the breakdown mechanism as designed.

Before the ESD pulse is imposed upon the chip and the terminals of the chip are neutral, the output of the RC circuit 36 will be low. When an ESD pulse powers up the chip, the inverters will also be powered up. With the initial low output at node 42, the output of the first inverter 44 will provide a high $\overline{EN}$ signal and the output of the second inverter 46 will provide a low EN signal. Even when an ESD pulse is sensed, the enable signals remain the same during the entire pulse duration due to the relatively slow charging time of the capacitor 40. At some threshold voltage, the inverters 44 and 46 will switch states, such that EN is high and $\overline{EN}$ is low. Because of the relatively slow charging time, the inverters will not reach this threshold voltage during the short ESD pulse. For normal power up, an event that typically occurs in milliseconds, the inverters reverse states after a relatively short delay.

Figure 1:
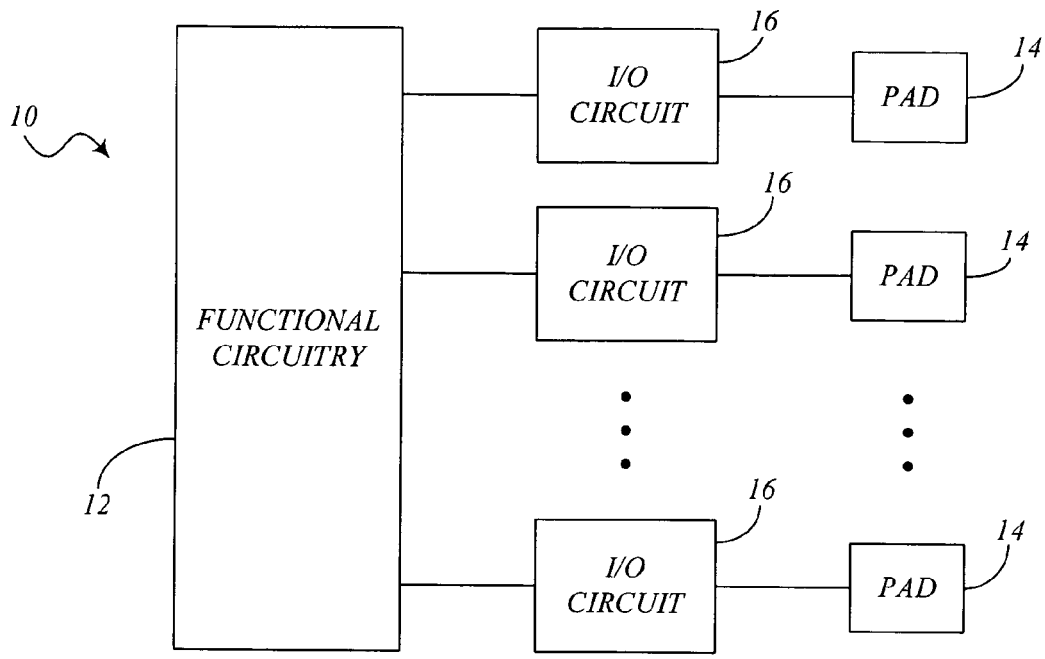
FIG. 1 is a block diagram illustrating a portion of a conventional semiconductor chip.
Figure 2:
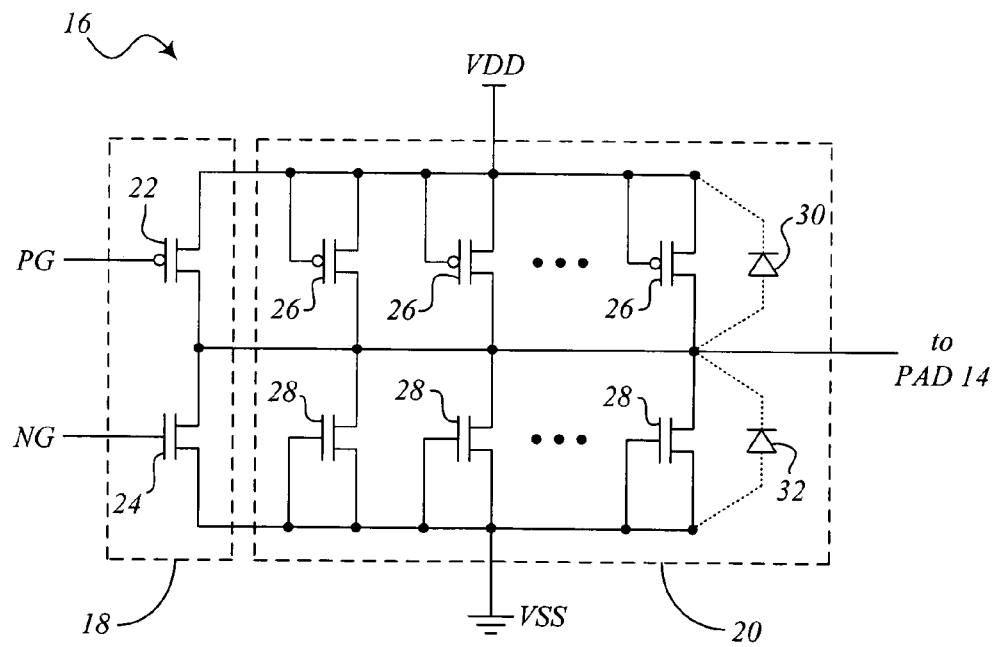
FIG. 2 is a schematic diagram illustrating a conventional I/O circuit having an output driver and an ESD protection circuit.
Figure 3B:
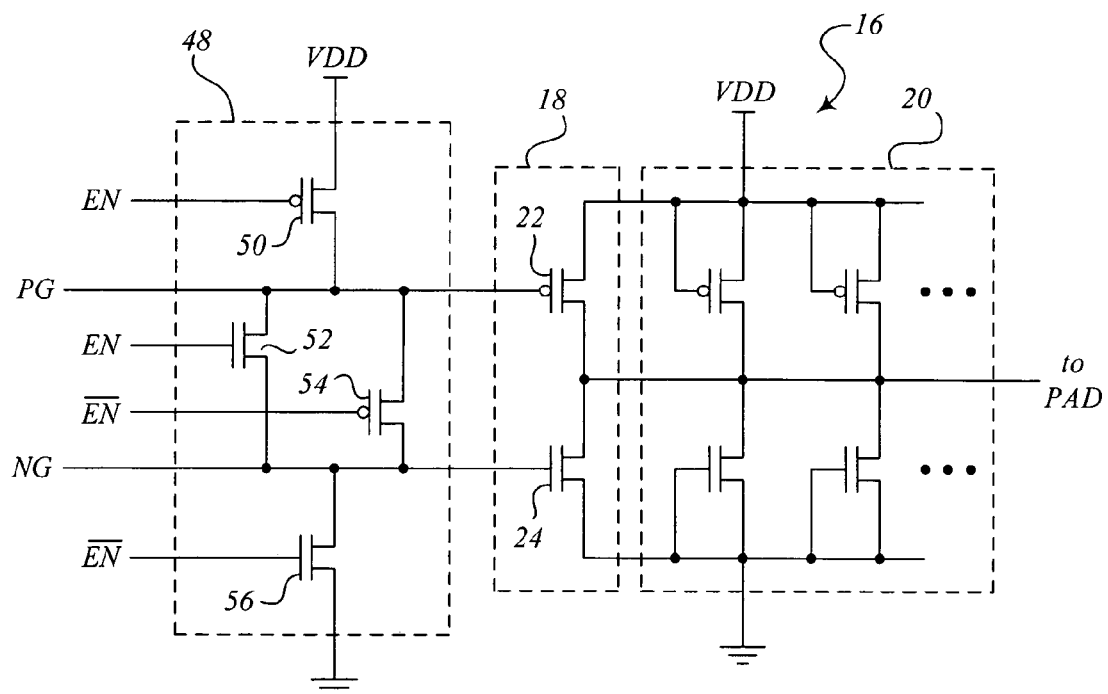
FIG. 3B is a schematic diagram illustrating an embodiment of a disable circuit for use with an I/O circuit.

FIG. 3B is a schematic diagram of an embodiment of a disable circuit 48 for providing control signals to an I/O circuit 16 having an output driver 18 and an ESD protection circuit 20. The output driver 18 and ESD protection circuit 20 function similarly as described with respect to FIG. 2. However, in contrast to the prior art, the output driver 18, as discussed below, also receives signals from the disable circuit 48. The disable circuit 48 receives EN and $\overline{EN}$ signals from the ESD sensing circuit 34 of FIG. 3A. The disable circuit 48 includes a PMOS transistor 50 connected from VDD to the PG input, an NMOS transistor 52 and a PMOS transistor 54 connected in parallel between the PG and NG inputs, and an NMOS transistor 56 connected from the NG input to VSS.

Immediately after the chip experiences an ESD pulse, the EN signal will be low and the $\overline{EN}$ signal will be high, as mentioned above. At the moment the ESD pulse powers up VDD and the ESD sensing circuit 34 senses the ESD, the EN and $\overline{EN}$ signals will initially remain in their current state. With such a state, the PMOS transistor 50 and NMOS transistor 56 will be turned on, thereby connecting the input (or gate) of the PMOS transistor 22 of the output driver 18 to VDD and connecting the input of the NMOS transistor 24 of the output driver 18 to VSS. In this regard, both the PMOS transistor 22 and the NMOS transistor 24 are shut off so that the very high ESD currents at the pad will not cause a current to flow through the transistors that would likely destroy them. Also, the EN and $\overline{EN}$ signals will turn off the transistors 52 and 54, isolating the PG input from the NG input and also isolating VDD from VSS.

During normal operation, when the chip is first powered up by a normal power source, the output driver 18 will initially be disabled. As the RC circuit 36 approaches a steady state after a short power up sequence, e.g. about 1 μsec, a voltage at node 42 reaches the threshold voltage causing the inversion of the EN and $\overline{EN}$ signals. At this time, the PMOS transistor 50 and NMOS transistor 56 are turned off, thereby removing the disabling gate control signals to the transistors 22 and 24 of the output driver 18, allowing them to operate in a normal fashion.

It should be recognized that the disable circuit 48 may be considered to be a three-state device. In a first state, while the device is powering up from an ESD pulse or a normal power source, both the PMOS transistor 22 and NMOS transistor 24 will be turned off, allowing the pad to float. During normal operation, the functional circuitry of the chip can provide a second state by turning the PMOS transistor 22 on and turning the NMOS transistor 24 off. The pad is switched high at this time. The third state occurs when the functional circuitry turns the PMOS transistor 22 off and turns the NMOS transistor 24 on. The pad is switched low at this time.

In the embodiment shown in FIG. 3B, the PG and NG inputs are connected together by a high EN signal at the NMOS transistor 52 and a low $\overline{EN}$ signal at the PMOS transistor 54. It should be understood that one or the other of the transistors 52 or 54 may be omitted for simplicity. In this respect, only one of these transistors is required to connect the PG and NG inputs when EN is high and $\overline{EN}$ is low.

Alternatively, the disabling circuit 48 may be configured with both the NMOS 52 and the PMOS 54 omitted. In this configuration, the PG and NG inputs are separated from each other during normal operation. Thus, the PG and NG will be isolated from each other during the power up phase when VDD is applied to the PMOS transistor 22 and VSS is applied to the NMOS transistor 24. Functional circuitry of the chip can be designed with this alternative embodiment to switch the PG and NG inputs individually. Before inverting the PG and NG inputs, the functional circuitry may momentarily turn both transistors off before switching one on. In this respect, a low impedance path from VDD to VSS will not be created, which would waste energy.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

I claim:

1. A circuit for protecting a semiconductor chip from an electrostatic discharge (ESD) event, the circuit comprising:
   an ESD sensing circuit including an RC circuit, a first inverter, and a second inverter, the RC circuit connected between VDD and VSS, the first inverter connected between the second inverter and the RC circuit, the output of the second inverter providing an enable signal EN, the output of the first inverter providing a signal $\overline{EN}$ that is the inverse of EN; and
   a disable circuit configured to receive the EN and $\overline{EN}$ signals and disable the transistors of an output driver of the semiconductor chip, the disable circuit comprising:
      a first PMOS transistor configured to receive the EN signal at its gate and further configured to connect a second PMOS transistor to VDD when EN is low; and
      a first NMOS transistor configured to receive the $\overline{EN}$ signal at its gate and further configured to connect a second NMOS transistor to VSS when $\overline{EN}$ is high.

2. The circuit of claim 1, wherein the second PMOS transistor and the second NMOS transistor are part of the output driver.

3. The circuit of claim 2, wherein the second PMOS transistor is configured to receive a gate control signal PG at its gate and the second NMOS transistor is configured to receive a gate control signal NG at its gate.

4. The circuit of claim 1, wherein the disable circuit further comprises:
   a third PMOS transistor connected between the gate of the second PMOS transistor and the gate of the second NMOS transistor; and
   a third NMOS transistor connected between the gate of the second PMOS transistor and the gate of the second NMOS transistor.

5. The circuit of claim 4, wherein the third PMOS transistor is configured to receive the signal $\overline{EN}$ at its gate and the third NMOS transistor is configured to receive the signal EN at its gate.

6. A transient protection device comprising:
   means for sensing a transient applied to a semiconductor chip, the sensing means including means for providing an enable signal EN and an inverse enable signal $\overline{EN}$; and
   a disable circuit configured to receive the EN and $\overline{EN}$ signals and disable the transistors of an output driver of the semiconductor chip, the disable circuit comprising:
      a first PMOS transistor configured to receive the EN signal at its gate and further configured to connect a second PMOS transistor to VDD when EN is low; and
      a first NMOS transistor configured to receive the EN signal at its gate and further configured to connect a second NMOS transistor to VSS when $\overline{EN}$ is high.

7. The device of claim 6, wherein the transient is caused by an electrostatic discharge.

8. The device of claim 6, wherein the transient is applied to the semiconductor chip causing the chip to power up.

9. The transient protection device of claim 6, wherein the second PMOS transistor and the second NMOS transistor are part of the output driver.

10. The transient protection device of claim 9, wherein the second PMOS transistor is configured to receive a gate control signal PG at its gate and the second NMOS transistor is configured to receive a gate control signal NG at its gate.

11. The transient protection device of claim 6, wherein the disable circuit further comprises:
    a third PMOS transistor connected between the gate of the second PMOS transistor and the gate of the second NMOS transistor; and
    a third NMOS transistor connected between the gate of the second PMOS transistor and the gate of the second NMOS transistor.

12. The transient protection device of claim 11, wherein the third PMOS transistor is configured to receive the signal $\overline{EN}$ at its gate and the third NMOS transistor is configured to receive the signal EN at its gate.

13. A method for protecting a circuit from an electrostatic discharge (ESD) event, the method comprising:
    sensing when a circuit to be protected is powering up;
    providing a pair of complementary enable signals in response to sensing when the circuit is powering up; and
    disabling an output driver of the circuit to be protected in response to the pair of complementary enable signals, the disabling further comprising:
       receiving one of the complementary enable signals at a gate of a first PMOS transistor;
       connecting, by the first PMOS transistor, a second PMOS transistor to VDD when the one of the complementary enable signals is low;
       receiving another of the complementary enable signals at a gate of a first NMOS transistor; and
       connecting, by the first NMOS transistor, a second NMOS transistor to VSS when the another of the complementary enable signals is high.

14. The method of claim 13, wherein sensing when the circuit to be protected is powering up further comprises sensing when an ESD event causes the circuit to power up.

15. The method of claim 14, further comprising: providing an RC circuit to sense when the circuit to be protected is powering up.

16. The method of claim 15, wherein sensing when the circuit to be protected is powering up further comprises charging a capacitor of the RC circuit at a rate that does not allow an ESD pulse to reach a destructive voltage.

17. The method of claim 13, wherein the second PMOS transistor and the second NMOS transistor are part of the output driver.

18. The method of claim 17, wherein the disabling further comprises:
    receiving a gate control signal PG at a gate of the second PMOS transistor; and
    receiving a gate control signal NG at a gate of the second NMOS transistor.

19. The method of claim 13, wherein the disabling further comprises:
    receiving the another of the complementary enable signals at a gate of a third PMOS transistor, the third PMOS transistor connected between the gate of the second PMOS transistor and a gate of the second NMOS transistor; and
    receiving the one of the complementary enable signals at a gate of a third NMOS transistor, the third NMOS transistor connected between the gate of the second PMOS transistor and the gate of the second NMOS transistor.

* * * * *